(12) United States Patent
Yamada (10) Patent No.: US 7,431,591 B2
(45) Date of Patent: Oct. 7, 2008

(54) SOCKET FOR ELECTRICAL PARTS (75) Inventor: Takayuki Yamada, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 10/372,170

(22) Filed: Feb. 25, 2003

(65) Prior Publication Data
US 2003/0162418 A1 Aug. 28, 2003

(30) Foreign Application Priority Data
Feb. 27, 2002 (JP) ............... 2002-050624

(51) Int. Cl.
H01R 12/00 (2006.01)
H05K 1/00 (2006.01)
(52) U.S. Cl. .......................... 439/71; 439/66
(58) Field of Classification Search .............. 439/68, 439/66, 591, 630, 862, 71
See application file for complete search history.

(56) References Cited
U.S. PATENT DOCUMENTS 3,940,786 A * 2/1976 Scheingold et al. ........... 439/71
3,993,384 A * 11/1976 Dennis et al. ............... 439/331
4,050,755 A * 9/1977 Hasircoglu ................... 439/71
5,437,556 A * 8/1995 Bargain et al. ................ 439/71
5,957,703 A * 9/1999 Arai et al. ..................... 439/66
6,227,869 B1 * 5/2001 Lin et al. ....................... 439/66
6,296,495 B1 * 10/2001 Wang et al. ................... 439/66
6,299,458 B1 * 10/2001 Yamagami et al. ............ 439/66
6,305,948 B1 * 10/2001 Wu ............................ 439/630

FOREIGN PATENT DOCUMENTS

JP 2000-067952 3/2000
JP 2001-167857 6/2001

* cited by examiner

Primary Examiner—Felix O. Figueroa
(74) Attorney, Agent, or Firm—Staas & Halsey LLP (57) ABSTRACT A socket for an electrical part has a socket body, having one and another surfaces to which an electrical part and a printed circuit board are mounted, respectively, to which a contact pin is arranged so as to establish electrical conduction between the electrical part and a printed circuit board. The contact pin comprises a first contact portion contacting the printed circuit board, a first spring portion urging the first contact portion towards the printed circuit board, a second contact portion contacting a terminal of the electrical part and a second spring portion urging the second contact portion towards the terminal of the electrical part. The second spring portion is disposed between the first and second contact portions so as to constitute an electrical path between the terminal of the electrical part and the printed circuit board.

15 Claims, 6 Drawing Sheets

PRIOR ART

SOCKET FOR ELECTRICAL PARTS

BACKGROUND OF THE INVENTION

1. Field of the Invention

The present invention relates to a socket for an electrical part disposed between an electrical part such as a semiconductor device (called as "IC package" hereinlater), and a printed circuit board to thereby realize electrical connection of the electrical part to the printed circuit board.

2. Related Art of the Invention

Figure 10:
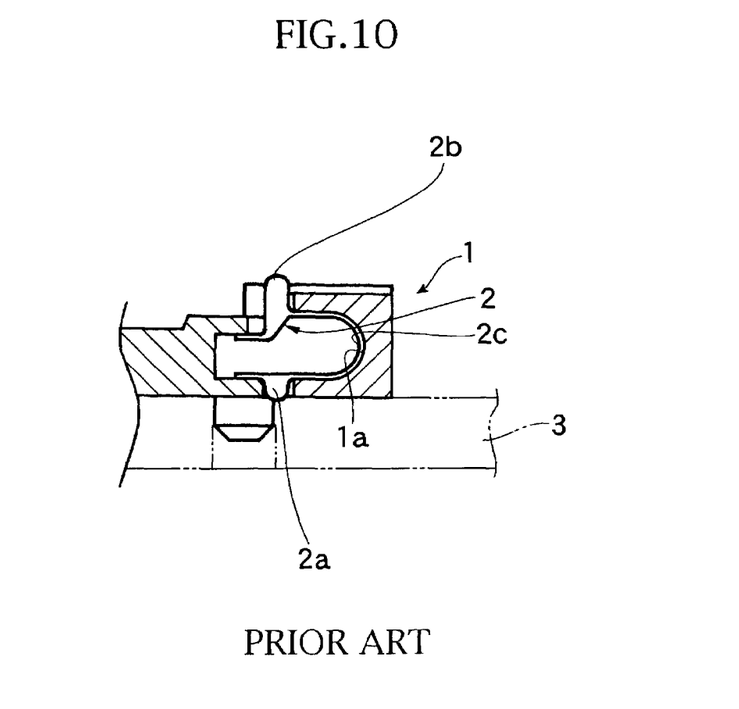
FIG. 10 is a sectional view showing a conventional structure of an IC socket.

In a known art, there has been provided an IC socket, as "socket for an electrical part" as, for example, shown in FIG. 10, which is provided with a socket body 1 having a recessed portion 1a in which a contact pin 2 is accommodated, and a printed circuit board 3 is arranged on the lower side of the socket body 1 and an IC package as the electrical part is disposed on the upper side thereof, though not shown.

The contact pin 2 is formed with a lower first contact portion 2a and an upper second contact portion 2b, as viewed in FIG. 10, and a substantially U-shaped spring portion 2c is formed between these first and second contact portions 2a and 2b. The first contact portion 2a is contacted to the printed circuit board 3 and the second contact portion 2b is, on the other hand, connected to a terminal of the IC package so that the printed circuit board 3 and the IC package terminal are electrically connected by means of the contact pin 2.

According to such electrical connection, a performance test of the IC package is carried out by using an IC test device, and in accordance with the test results, products of IC packages are classified into good ones and defective ones.

However, in such conventional structure, there has been adopted a structure for ensuring contacting pressure between the printed circuit board 3 and the IC package terminal by urging both the contact portions 2a and 2b by the U-shaped spring portion 2c. Accordingly, it is obliged for the U-shaped portion to have a relatively long length and have a long electrical path in order to ensure a proper displacement of the contact portions 2a and 2b. It is therefore difficult to carry out the performance test of the IC package of high frequency in a good state, thus being inconvenient.

SUMMARY OF THE INVENTION

An object of the present invention is to substantially eliminate defects or inconveniences encountered in the prior art mentioned above and to provide a socket for electrical parts capable of ensuring contacting pressure of a printed circuit board to an electrical part and make shorter an electrical path from the electrical part to the printed circuit board.

This and other objects can be achieved according to the present invention by providing a socket for an electrical part having a socket body, in which the socket body has one and another surfaces to which an electrical part and a printed circuit board are mounted, respectively, and a contact pin is arranged to the socket body so as to establish electrical conduction between the electrical part and the printed circuit board, wherein the contact pin comprises a first contact portion contacting the printed circuit board, a first spring portion urging the first contact portion towards the printed circuit board, a second contact portion contacting a terminal of the electrical part and a second spring portion urging the second contact portion towards the terminal of the electrical part, the second spring portion being disposed between the first and the second contact portions so as to constitute an electrical path between the terminal of the electrical part and the printed circuit board.

In a preferred embodiment, the first and second spring portions have elasticities different from each other.

The contact pin further comprises a base portion attached to the socket body, the first spring portion extends from the base portion and the first contact portion is formed to an extending end of the first spring portion, the second spring portion extending from the first contact portion and the second contact portion being formed to an extending end side of the second spring portion.

The first contact portion has a protruded portion protruded in one direction and the second contact portion has a protruded portion protruded in a direction opposing to the one direction of the first contact portion. The second spring portion connecting the first and second contact portion includes a curved portion.

According to the structure of the present invention mentioned above, the spring portion of the contact pin is divided into two (first and second) portions to thereby reduce the motion thereof and make larger the elasticity (elastic force) thereof, thus effectively ensuring the contacting pressure of the first contact portion to the printed circuit board and the contacting pressure of the second contact portion to the electrical part.

Since the second spring portion constitutes an electrical path between the printed circuit board and the electrical part so as to reduce the length of the electrical path, the performance test of an electrical part of high frequency use can be carried out with high efficiency.

Furthermore, since the first and second spring portions can be formed with different elasticity, the contacting pressure can be optionally set respectively.

In addition, according to the structure of the contact pin of the present invention, the contact pin can be easily manufactured from one sheet of conductive plate member.

The nature and further characteristic features of the present invention will be made more clear from the following descriptions made with reference to the accompanying drawings.

BRIEF DESCRIPTION OF THE DRAWINGS

In the accompanying drawings:

FIG. 6 shows an IC package according to the first embodiment of the present invention and includes FIG. 6A being a plan view of the IC package and FIG. 6B being a right side view of FIG. 6A;

DESCRIPTION OF THE PREFERRED EMBODIMENTS

Preferred embodiments of the present invention will be described hereunder with reference to FIGS. 1 to 9. Further, it is first to be noted that terms "upper", "lower", "right' and "left" and the like terms are used herein with reference to illustrations of the figures of the drawings.

Figure 6A:
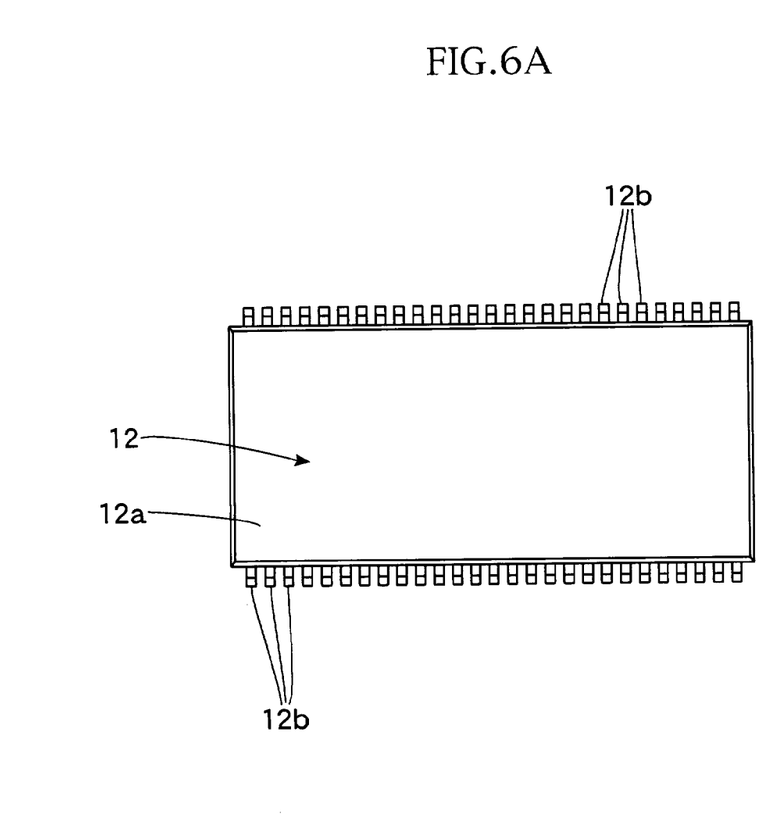
Figure 6B:
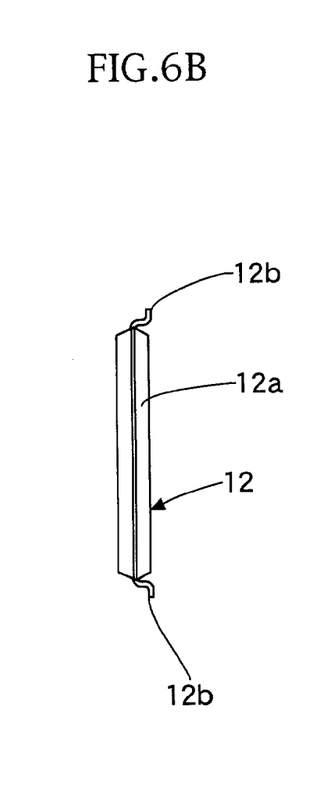

In these figures, reference numeral 11 denotes an IC socket as a socket for an electrical part, and the IC socket 11 is a socket for carrying out a performance test of IC package 12 as "electrical part" shown in FIGS. 6A and 6B so as to achieve an electrical connection between a terminal 12b of the IC package 12 and a printed circuit board 13 on an IC test device side.

The IC package 12 has a structure, as shown in FIGS. 6A and 6B, in which a number of terminals 12b project sideway from side surface portions of a rectangular package body 12a in the shape of crank with predetermined pitch.

On the other hand, the IC socket 11 has a structure in which a number of contact pins 15 are arranged to a socket body 14 formed from synthetic resin so as to provide an insulating property, and the IC package 12 and the printed circuit board 13 are electrically connected through the contact pins 5.

Figure 1:
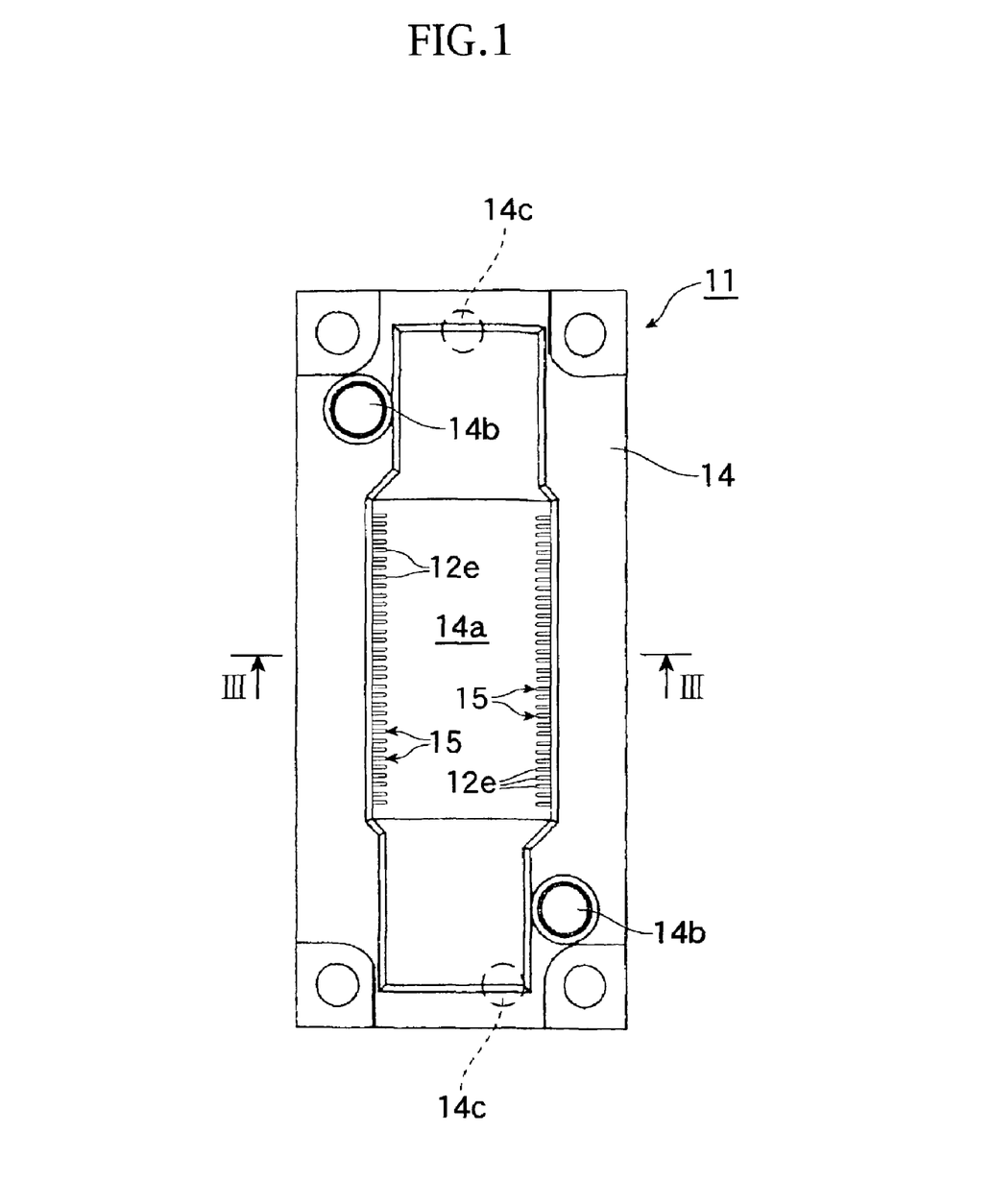
FIG. 1 is a plan view of an IC socket according to a first embodiment of the present invention.
Figure 2:
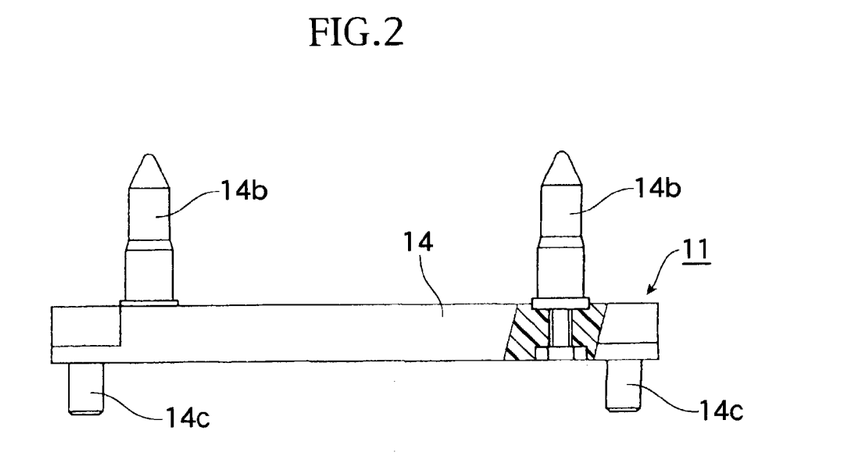
FIG. 2 is a right side view, partially broken away, of the first embodiment of FIG. 1.
Figure 3:
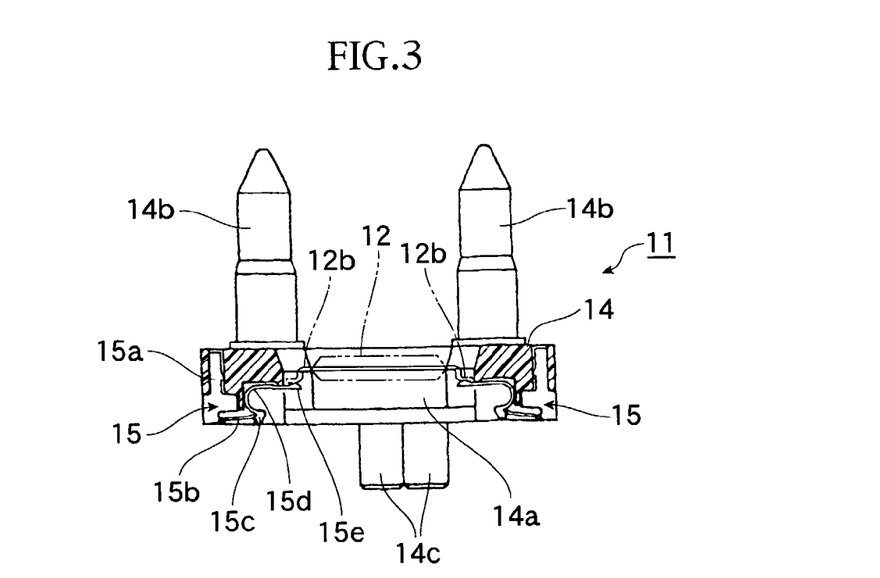
FIG. 3 is a sectional view taken along the line III-III shown in FIG. 1.

The socket body 14 has, as shown in FIGS. 1 and 3, a rectangular shape and has an opening 14a formed to a central portion of the rectangular socket body and a pair of positioning pins 14b formed to an upper surface portion thereof. Fitting (engaging) pins 14c are also formed to a lower surface portion of the socket body 14.

When the IC socket 11 and IC carriers 20 (FIG. 7) for holding the IC package 12 are positioned, the positioning pins 14b are fitted to the IC carriers 20, which are conveyed by an automatic machine or like. Further, the fitting pins 14c are fitted to fitting holes 13a formed to the printed circuit board 13 to thereby establish the positioning relationship between the IC socket 11 and the printed circuit board 13.

The contact pins 15 are formed through a punching process of a thin plate having conductive and springy property and are arranged in accordance with a number of the terminals 12b of the IC package 12 and a distance between adjacent terminals.

Figure 4:
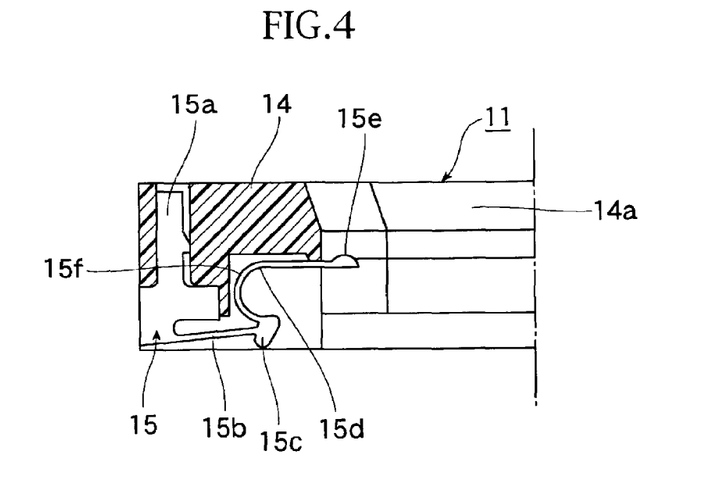
FIG. 4 is a sectional view showing an arrangement of a contact pin of the IC socket according to the first embodiment.
Figure 5:
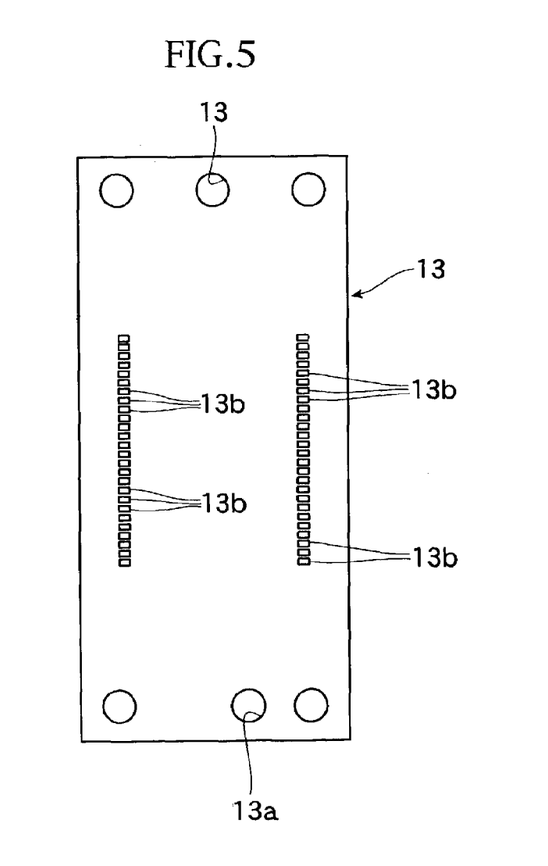
FIG. 5 is an illustration of a plan view of a printed circuit board concerning the first embodiment of FIG. 1.

Each of the contact pins 15 comprises, as shown in FIGS. 3 and 4, a base portion 15a attached to the socket body 14, a first spring portion 15b extending from the base portion 15a, a first contact portion 15c formed to a front end side of the first spring portion 15b, a second spring portion 15d extending from the first contact portion 15c and a second contact portion 15e formed to the front end side of the second spring portion 15d.

The base portion 15a of the contact pin 15 is mounted to the socket body 14 through the fitting engagement with the fitting hole 14d formed to the socket body 14. The first contact portion 15c has a protruded structure projecting downward, as viewed, so as to contact to an electrode portion 13b of the printed circuit board 13 so that the first contact portion 15c is urged on the side of the printed circuit board 13 by the first spring portion 15b.

The second contact portion 15e has a protruded structure projecting upward, as viewed, so as to contact the IC package terminal 12b so that the second contact portion 15e is urged on the side of the terminal 12b by means of second spring portion 15d.

This second spring portion 15d is disposed between the first contact portion 15c and the second contact portion 15e and constitutes single electrical path between the IC package terminal 12b and the printed circuit board 13 so that there is no contact between the second spring portion 15d and the first spring portion 15b. This second spring portion 15d includes the curved portion 15f.

The second contact portion 15e is positioned so as to project into the opening 14a of the socket body 14 as shown in FIGS. 1 and 4.

The IC socket 11 having the structure mentioned above will be used in the following manner.

The fitting pins 14c of the IC socket 11 are preliminarily fitted into the fitting holes 13a of the printed circuit board 13 so as to be fixed to the predetermined position. In this state, the first contact portion 15c of each contact pin 15 is pressed against the electrode portion 13b of the printed circuit board 13 by the urging force of the first spring portion 15b so as to keep predetermined contacting pressure.

Figure 7:
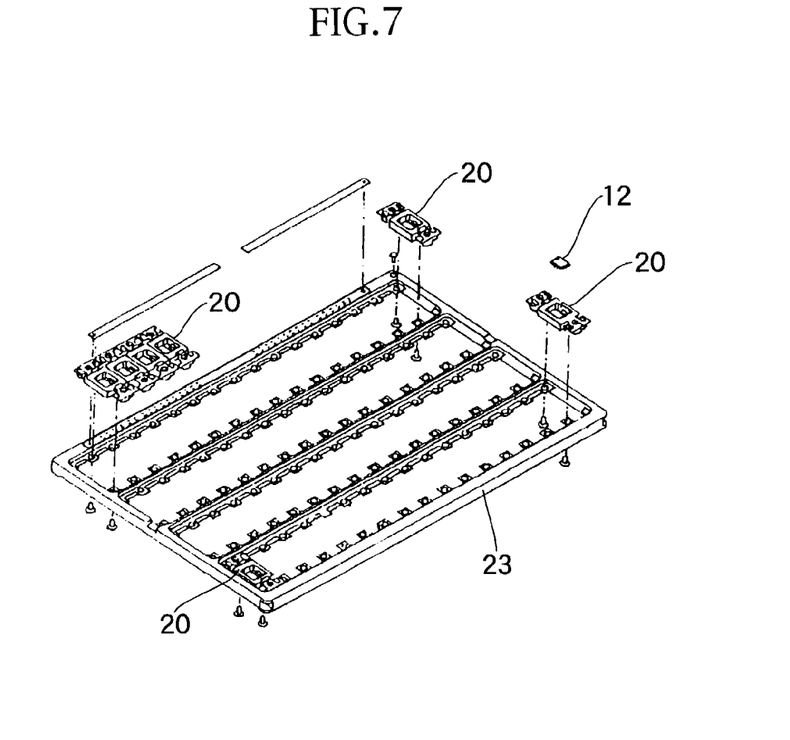
FIG. 7 is a perspective view of a test tray, an IC carrier, etc. concerning the first embodiment of the present invention.

As shown in FIG. 7, on the other hand, a number of IC carriers 20 are mounted to a test tray 23 of a handler and the IC package 12 is positioned and held to and by these IC carriers 20. Under the state, the test tray 23 is conveyed by a device not shown, and the IC carriers 20 are placed on a plurality of IC sockets 11 arranged to predetermined positions of the printed circuit board 13 on an IC test device side.

Thereafter, by lowering the test tray 23, the positioning pins 14b of the IC socket 11 are fitted to the positioning holes formed to the IC carriers 20. Under the state, the IC carriers 20, i.e. the IC package 12, the IC socket 11 and the printed circuit board 13 can be assembled together with their predetermined positional relationship.

Next, the IC package 12 is pressed from the upper side thereof by a press contact, not shown, disposed on the handler side, and then, the terminal 12b of the IC package 12 is press-contacted to the second contact portion 15e of the contact pin 15.

In this operation, the second spring portion 15d of the contact pin 15 is elastically deformed so as to establish the abutting state of the IC package terminal 12b against the second contact portion 15e. According to this motion, the IC package 12 is electrically connected to the printed circuit board 13 through the IC socket 11, thus carrying out the performance test of the IC package 12 by using the IC test device. According to the test result, the IC packages are classified into good ones and defective ones.

As mentioned above, according to the present invention, since a spring portion of the contact pin 15 is divided into two, i.e. first and second, spring portions 15b and 15d, the motion (operation) of these spring portions 15b and 15d can be made small or compact, so that the elasticity of each spring portion 15b (15d) can be made larger to thereby ensure the contacting pressure of the first contact portion 15c to the printed circuit board 13 and the contacting pressure of the second contact portion 15e to the terminal 12b of the IC package 12 can be properly ensured.

In addition, the second spring portion 15d constitutes an electrical path between the printed circuit board 13 and the IC package terminal 12b to thereby make shorter the electric path, thus effectively carrying out the performance test of the high frequency IC package 12.

Further, by changing the urging forces (elasticities) of the first and the second spring portions 15b and 15d, the contacting pressure to the IC package terminal 12b or to the printed circuit board 13 can be made different.

Second Embodiment

Figure 8:
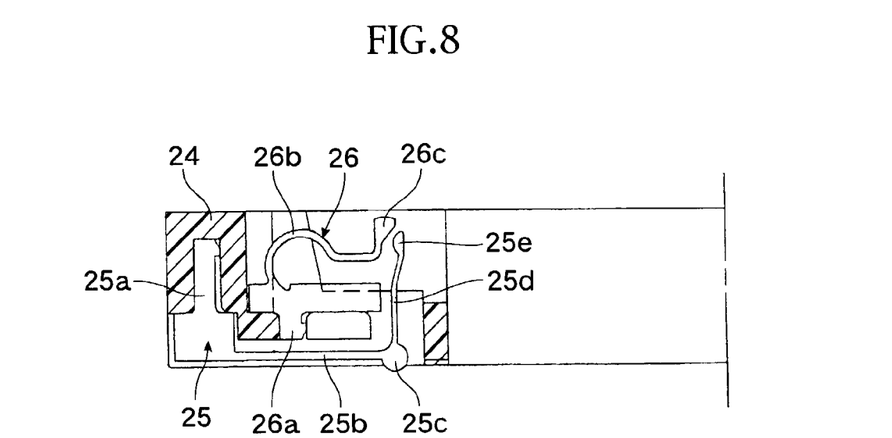
FIG. 8 is a sectional view, in an enlarged scale, of an essential portion of an IC socket according to a second embodiment of the present invention, in which both contact portions of a contact pin are separated from each other.
Figure 9:
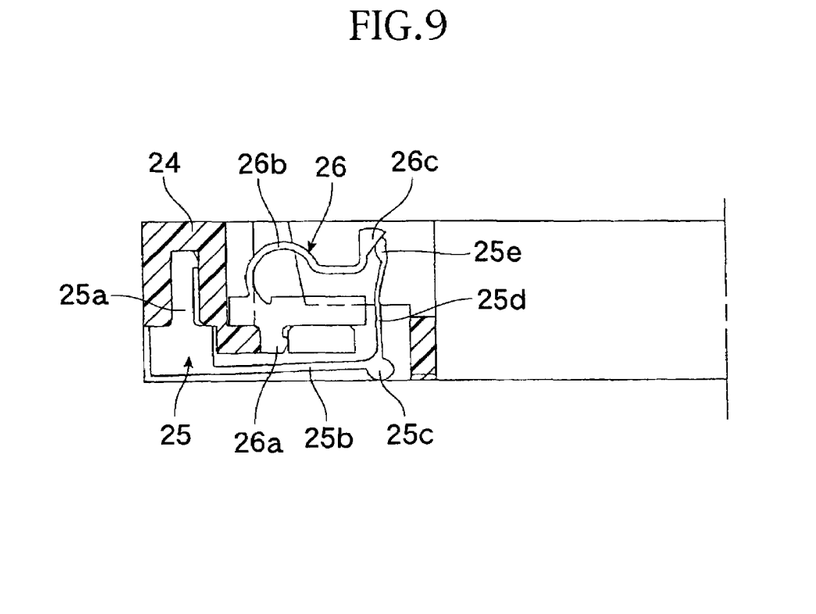
FIG. 9 is a sectional view, similar to FIG. 8, of the essential portion of the IC socket of the second embodiment, in which both the contact portions of a contact pin are in contact to each other.

A second embodiment of the present invention will be represented by FIGS. 8 and 9.

In this second embodiment, contact pins includes lower-side contact pins 25 and upper-side contact pins 26.

Each of the lower-side contact pins 25 is formed, as in the first embodiment mentioned above, through a punching process of a thin plate having conductive and springy property, and comprises a base portion 25a attached to a socket body 24, a first spring portion 25b substantially horizontally extending from the base portion 25a, a first contact portion 25c urged by the first spring portion 25b so as to contact a printed circuit board, not shown, a second spring portion 25d extending upward from the first contact portion 25c and a second contact portion 25e urged by the second spring portion 25d so as to contact a terminal of an IC package, not shown.

Each of the upper-side contact pins 26, on the other hand, comprises a base portion 26a attached to the socket body 24, a spring portion 26b extending from the base portion 26a and a contact portion 26c urged by the second spring portion 26b so as to contact a terminal of the IC package, not shown.

Under the accommodated state of the IC package, the IC package terminal is clamped between the second contact portion 25e of the lower-side contact pin 25 and the contact portion 26c of the upper-side contact pin 26 to thereby establish an electrical connection between the IC package terminal and the printed circuit board through the electrical path of the second spring portion 25d of the lower-side contact pin 25.

Further, it is to be noted that the present invention is not limited to the described embodiments and many other changes and modifications may be made without departing from the scopes of the appended claims.

For example, in the described embodiments of the present invention, although an electrical part is defined to the IC package 12 as shown in FIGS. 6A and 6B, other type IC packages or electrical parts may be preferably utilized.

What is claimed is:

1. A socket to electrically connect an electrical part and a printed circuit board, comprising:
   a socket body, comprising:
   first and second surfaces to which the electrical part and the printed circuit board are mounted, respectively, and
   a contact pin arranged on the socket body to establish electrical conduction between the electrical part and the printed circuit board,
   wherein:
   said contact pin is formed from a conductive and elastic plate having a plane surface,
   said contact pin comprises a base portion attached to the socket body and unmovable in an upward direction relative to the socket body, a first spring portion extending from the base portion, a first contact portion formed on a front end side of the first spring portion and contacting the printed circuit board, a second spring portion extending directly from the first contact portion to form a free end, the second spring portion comprising a straight portion and only one curved portion, and a second contact portion formed on the free end and only contacting a terminal of the electrical part without contacting the base portion, the base portion, the first and second spring portions, and the first and second contact portions having surfaces extending along the plane surface,
   the first contact portion has a width along the plane surface wider than a width of each of said first and second spring portions so as not to be elastically deformed when the first contact portion is contacted with the printed circuit board, and
   said second spring portion being disposed between the first and second contact portions to constitute a single electrical path between the terminal of the electrical part and the printed circuit board so that all of an electric current which flows from the terminal of the electrical part to the printed circuit board flows solely along an entire length of the second spring portion.

2. The socket according to claim 1, wherein said first and the second spring portions have elastic forces different from each other.

3. The socket according to claim 1, wherein said first contact portion has a protruded portion protruded in one direction and said second contact portion has a protruded portion protruded in a direction opposing to the one direction of the first contact portion.

4. The socket according to claim 1, wherein said second spring portion connecting the first and second contact portion includes a curved portion.

5. The socket according to claim 1, wherein a force of the electrical part on the second contact portion directly pushes the first contact portion via the second spring portion.

6. A socket to connect an electrical part and a circuit board, comprising:
   a contact pin, formed from a plate having a plane surface, to establish electrical conduction between the electrical part and the circuit board, comprising:
   a base portion that cannot be moved in a direction away from the circuit board relative to the circuit board;
   a first spring portion extending from the base portion;
   a first contact portion to contact the circuit board;
   a second spring portion extending directly from the first contact portion to form a free end and forming a single electrical path between the electrical part and the circuit board, the second spring portion comprising a straight portion and only one curved portion, wherein all of an electric current which flows from the electrical part to the circuit board flows solely along an entire length of the second spring portion; and
   a second contact portion formed on the free end to contact only the electrical part without contacting the base portion,
   the base portion, the first and second spring portions and the first and second contact portions having surfaces extending along the plane surface, and the first contact portion having a width along the plane surface wider than a width of each of said first and second spring portions.

7. The socket according to claim 1, wherein the upward direction is a direction of moving away from the printed circuit board.

8. The socket according to claim 1, wherein the socket body further comprises a fitting engagement between the first and second surfaces, and the base portion abuts against the fitting engagement to thereby be unmovable in the upward direction.

9. A socket to connect an electrical part and a circuit board, comprising:
   a contact pin, formed from a plate having a plane surface, to establish electrical conduction between the electrical part and the circuit board, comprising a base portion, first and second contact portions extending from the base portion to respectively contact the circuit board and the electrical part and a spring portion between the first and second contact portions, the spring portion extending directly from the first contact portion to form a free end, the spring portion comprising a straight portion and only one curved portion, and the second contact portion being formed on the free end and only contacting a terminal of the electrical part without contacting the base portion, the base portion, the first and second contact portions and the spring portion having surfaces extending along the plane surface and the first contact portion has a width along the plane surface wider than a width of said spring portion; and a socket body having a first surface to mount the electrical part and a second surface to contact the base portion to thereby prevent the base portion from moving in a direction relative to the socket body and away from the circuit board, wherein all of an electric current which flows from the electrical part to the circuit board flows solely along an entire length of the spring portion.

10. The socket according to claim 9, wherein the spring portion forms a single electrical path between the electrical part and the circuit board.

11. The socket according to claim 1, wherein the first spring portion does not contact the second spring portion.

12. The socket according to claim 1, wherein the second spring portion contacts only the first and second contact portions.

13. The socket according to claim 1, wherein the plane surface extends in a direction parallel to a direction of pressure placed on the contact pin by the electrical part and the printed circuit board.

14. A socket to electrically connect an electrical part and a printed circuit board, comprising:

a socket body, comprising:

first and second surfaces to which the electrical part and the printed circuit board are mounted, respectively, and a contact pin arranged on the socket body to establish electrical conduction between the electrical part and the printed circuit board, wherein:

said contact pin is formed from a conductive and elastic plate having a plane surface, said contact pin comprises a base portion attached to the socket body and unmovable in an upward direction relative to the socket body, a first spring portion extending from the base portion, a first contact portion formed on a front end side of the first spring portion and contacting the printed circuit board, a second spring portion, comprising a single curved portion extending directly from the first contact portion and a single straight portion extending directly from the curved portion to form a free end, and a second contact portion formed on the free end and selectively contacting a terminal of the electrical part, the second spring portion comprising the single curved portion and the single straight portion in both a contacted state and a state of non-contact between the second contact portion and the terminal, the base portion, the first and second spring portions, and the first and second contact portions having surfaces extending along the plane surface, the first contact portion has a width along the plane surface wider than a width of each of said first and second spring portions so as not to be elastically deformed when the first contact portion is contacted with the printed circuit board, and said second spring portion being disposed between the first and second contact portions to constitute a single electrical path between the terminal of the electrical part and the printed circuit board so that all of an electric current which flows from the terminal of the electrical part to the printed circuit board flows solely along an entire length of the second spring portion.

15. A socket to electrically connect an electrical part and a printed circuit board, comprising:

a socket body, comprising:

first and second surfaces to which the electrical part and the printed circuit board are mounted, respectively, and a contact pin arranged on the socket body to establish electrical conduction between the electrical part and the printed circuit board, wherein:

said contact pin is substantially flat as a whole and is formed from a conductive and elastic plate having a plane surface, said contact pin comprises a base portion attached to the socket body and unmovable in an upward direction relative to the socket body, a first spring portion extending from the base portion, a first contact portion formed on a front end side of the first spring portion and contacting the printed circuit board, a second spring portion extending directly from the first contact portion to form a free end, the second spring portion comprising a straight portion and only one curved portion, and a second contact portion formed on the free end and contacting a terminal of the electrical part without contacting the base portion, the base portion, the first and second spring portions, and the first and second contact portions having the plane surface, a width of the plane surface of the first contact portion across the extending direction of the contact pin is wider than a width of the plane surface of said first and second spring portions so as not to be elastically deformed when the first contact portion is contacted with the printed circuit board, and said second spring portion being disposed between the first and second contact portions to constitute a single electrical path between the terminal of the electrical part and the printed circuit board so that all of an electric current which flows from the terminal of the electrical part to the printed circuit board flows solely along an entire length of the second spring portion.

* * * * *